(12) United States Patent
Ambrose

(10) Patent No.: US 7,143,199 B1
(45) Date of Patent: Nov. 28, 2006

(54) FRAMING AND WORD ALIGNMENT FOR PARTIALLY RECONFIGURABLE PROGRAMMABLE CIRCUITS

(75) Inventor: Desmond Ambrose, Ottawa (CA)

(73) Assignee: Altera Corporation, San Jose, CA (US)

( * ) Notice: Subject to any disclaimer, the term of this patent is extended or adjusted under 35 U.S.C. 154(b) by 313 days.

(21) Appl. No.: 10/699,012

(22) Filed: Oct. 31, 2003

(51) Int. Cl.
G06F 3/00 (2006.01)
G06F 17/50 (2006.01)

(52) U.S. Cl. .............................. 710/8; 710/10; 710/14; 716/16

(58) Field of Classification Search ...................... None
See application file for complete search history.

(56) References Cited

U.S. PATENT DOCUMENTS

| 6,255,849 | B1 |   | 7/2001  | Mohan         |         |
|-----------|----|---|---------|---------------|---------|
| 6,567,413 | B1 | * | 5/2003  | Denton et al. | 370/401 |
| 6,970,966 | B1 | * | 11/2005 | Gemelli et al.| 710/305 |
| 2001/0002199 | A1 | * | 5/2001  | Hershey et al.| 370/505 |
| 2003/0193962 | A1 | * | 10/2003 | Primrose et al.| 370/411 |
| 2003/0198236 | A1 | * | 10/2003 | Denton et al. | 370/401 |

* cited by examiner

*Primary Examiner*—Kim Huynh
*Assistant Examiner*—Aurangzeb Hassan
(74) *Attorney, Agent, or Firm*—Townsend and Townsend and Crew LLP

(57) ABSTRACT

Techniques for aligning the data path inside a receiver to the word and frame boundaries of an input data stream using reconfigurable programmable circuit elements are provided. The input data stream can be organized according to a data transmission protocol such as SONET or SDH. A first programmable circuit elements are initially configured as a frame detection block. The frame detection block detects the boundaries between words in the input data. A portion of the frame detection block is then reconfigured as a word align block. Another portion of the frame detection block is reconfigured as a block that monitors bits in each frame to ensure that the frame boundaries remain in the same bit positions. If the frame boundaries change, the programmable circuit elements are reconfigured to implement the frame detection block again.

22 Claims, 4 Drawing Sheets

FRAMING AND WORD ALIGNMENT FOR PARTIALLY RECONFIGURABLE PROGRAMMABLE CIRCUITS

BACKGROUND OF THE INVENTION

The present invention relates to techniques for implementing a circuit that receives data frames, and more particularly, techniques for reconfiguring programmable portions of a logic circuit that detects data frames boundaries and aligns to an internal data bus appropriately given the detected word boundary in the frames.

At the beginning of each SONET or SDH frame is a framing pattern that consists of a repetition of 'hF6 followed by a repetition of 'h28. The length of the repetition is determined by the transmission rate(optical carrier level, or OC level), typically 1, 3, 12, 48, 192, or 768. The frame size, measured in time, is 125 μs. The amount of data transmitted in this time is equal to 810 bytes times the OC level. In a receiver, the frame boundary can be used to determine how to align in the incoming data stream to an internal data path. The amount of data processed every clock cycle corresponds to the internal data path width. This amount of data can be referred to as a word, and is typically 8, 16, 32, 64, 128, or 256 bits.

In SPI4.2, there is no frame, but some skew between each of the 16 data+1 control channels is allowed in the system. Without phase alignment, each channel would arrive at a receiver at slightly different times, mainly due to small differences in the length of the routing on a circuit board of each channel. The receiver handles the skew by delaying each channel independently as necessary to align transitions on all channels. The protocol changes between a training state where channel alignment is obtained, and an operating state where control and data is processed. Aligning all channels to a single clock is necessary prior to digital processing of the concatenation of channels.

From time to time, a SPI-4 transmitter will send a training pattern. This pattern is made up of some repetitions of a twenty word pattern. The twenty words are separated into ten consecutive words of data equal to 16'h0FFF and control equal to 1'b1, followed by ten consecutive words of data equal to 16'hF000 and control equal to 1'b0. The transition from the first ten words to the second ten words is the boundary used to perform alignment.

A receiver does not necessarily know what skew exists between channels when it receives SPI4.2 data and control or where words begin and end when it receives a serial stream of SONET/SDH data. Therefore, it would be desirable to provide techniques for aligning channels inside a receiver to the word boundaries of an input stream. It would also be desirable to minimize the amount of the circuitry used to perform the word boundary detection functions.

BRIEF SUMMARY OF THE INVENTION

The present invention relates to techniques for reconfiguring programmable circuit elements to detect data boundaries and/or to detect channel alignment. The present invention aligns incoming data words appropriately onto an internal data bus, while using the same reconfigurable programmable circuit elements to process the internal data once alignment is found.

The principals of the present invention can be used to facilitate protocols such as SONET (synchronous optical network), SDH (synchronous digital hierarchy), and OIF SPI4 phase 2 (SPI4.2).

According to an embodiment of the present invention, a partially reconfigurable programmable circuit is used to implement the data alignment. In a partially reconfigurable programmable circuit, programmable logic portions of the integrated circuit can be reconfigured without reconfiguring the entire integrated circuit. In a partially reconfigurable programmable circuit of the present invention, a framing or training finite state machine (FSM) residing outside of the partial reconfigurable logic region is responsible for loading and enabling different circuit elements in the partial reconfigurable logic region.

According to the present invention, the same block of programmable logic elements are used to implement two or more independent functions at different times. The block of programmable logic elements does not implement both functions simultaneously. As a result, less programmable logic elements in the integrated circuit are used to perform these functions. This technique greatly conserves programmable logic elements and frees up resources on a integrated circuit that can be programmed to perform other functions.

Protocols that have the following three criteria can benefit from techniques of the present invention. First, there is framing state separate from an operating state. The framing state is time generally used for finding alignment of data in an input, and the operating state is time generally used for processing the data. Second, a sufficient amount of time is allowed between the states that can be used to reprogram the applicable logic. Third, the amount of logic required during the framing state is larger than the amount of logic required to facilitate swapping between framing and operating states.

For SONET or other similar protocols, a first region of the partially reconfigurable programmable logic may implement a first circuit which constitutes a frame detection circuit. The frame detection circuit searches for a framing pattern in each bit position of the data path. When the framing pattern is detected at some bit position, the frame detection circuit reports the position to the framing FSM. The framing FSM is implemented outside the first region.

The first region of the partially reconfigurable programmable logic may implement a second and third circuit. The second circuit constitutes one of several possible word alignment circuits. The third circuit constitutes other data processing logic that is not necessary while frame detection is occurring. Part of the third circuit is responsible for determining if alignment on the interface is lost, and signals the framing FSM.

For SPI-4 or similar protocols, a first region of the partially reconfigurable programmable logic may implement a first circuit that constitutes a channel alignment detection circuit. The channel alignment detection circuit determines skew between the input channels. When the skew has been accurately detected, the channel alignment detection circuit reports the skew to the training FSM. The training FSM is implemented outside the first region.

The first region of the partially reconfigurable programmable logic may implement a second and third circuit. The second circuit constitutes phase alignment and/or word alignment circuit. The third circuit constitutes other data processing logic that is not necessary while frame detection is occurring. Part of the third circuit is responsible for determining if alignment on the interface is lost, and signals the training FSM.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
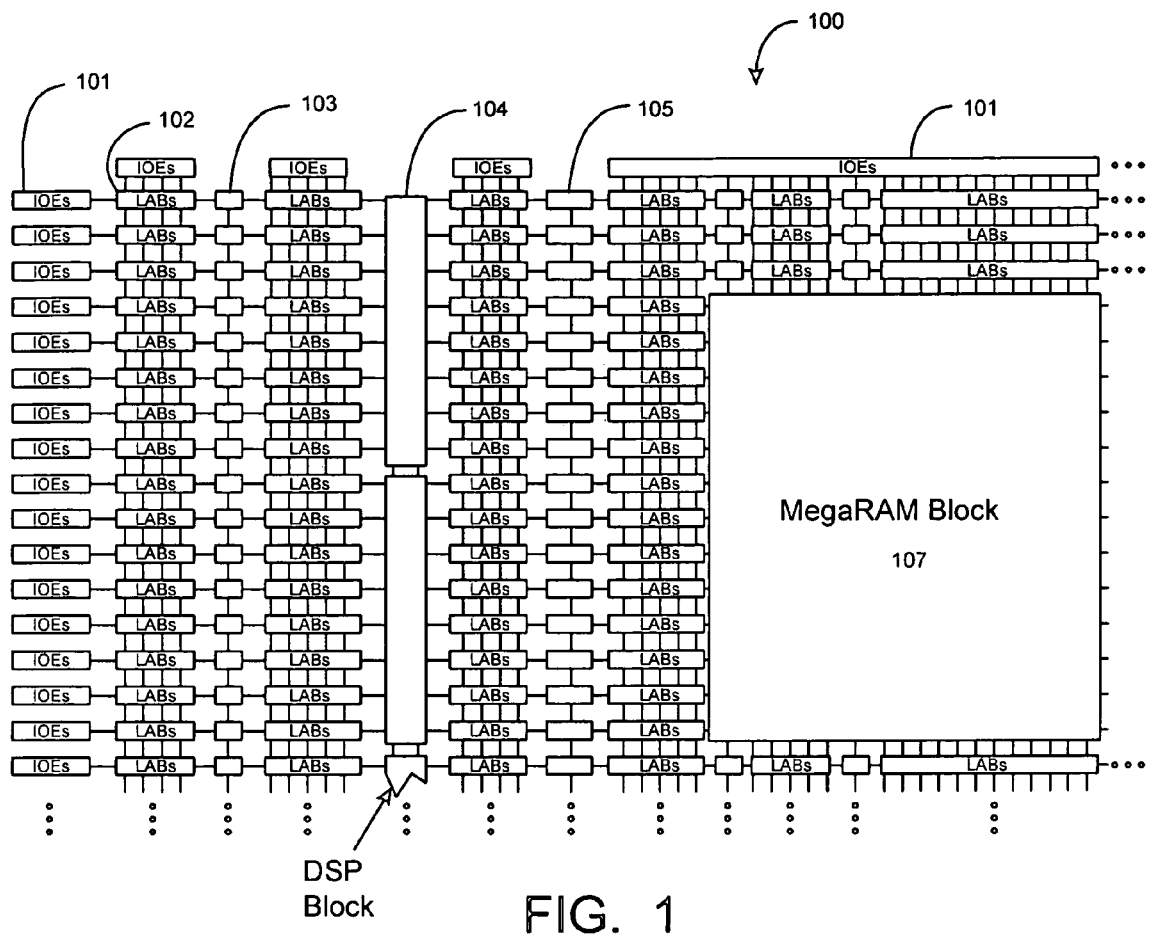
FIG. 1 is a simplified block diagram of an example programmable logic device that can implement embodiments of the present invention.

Today's high-density programmable logic devices (PLDs) are used to implement custom logic with a quick turnaround. PLDs also provide resources that allow them to implement system solutions for networking, wireless, and general high-bandwidth telecommunication applications. FIG. 1 illustrates a high-density PLD 100. PLD 100 illustrates an example of a PLD architecture that can be built to implement techniques of the present invention.

PLD 100 includes a two-dimensional array of programmable logic array blocks (or LABs) 102 that are interconnected by a network of column and row interconnects of varying length and speed. Each of LABs 102 includes multiple (e.g., 10) logic elements (or LEs). An LE is a small unit of logic that provides for efficient implementation of user defined logic functions. PLD 100 also includes a distributed memory structure including RAM blocks of varying sizes provided throughout the array. The RAM blocks include, for example, 512 bit blocks 103, 4K blocks 105 and a MegaBlock 107 providing 512K bits of RAM. These memory blocks may also include shift registers and FIFO buffers.

PLD 100 further includes digital signal processing (DSP) blocks 104 that can implement, for example, multipliers with add or subtract features. I/O elements (IOEs) 101 located, in this example, around the periphery of the device can support numerous single-ended and differential I/O standards. It is to be understood that PLD 100 is described herein for illustrative purposes only and that the present invention can be implemented in many different types of PLDs, field programmable gate arrays, programmable logic arrays, configurable logic arrays, and the like.

Figure 2:
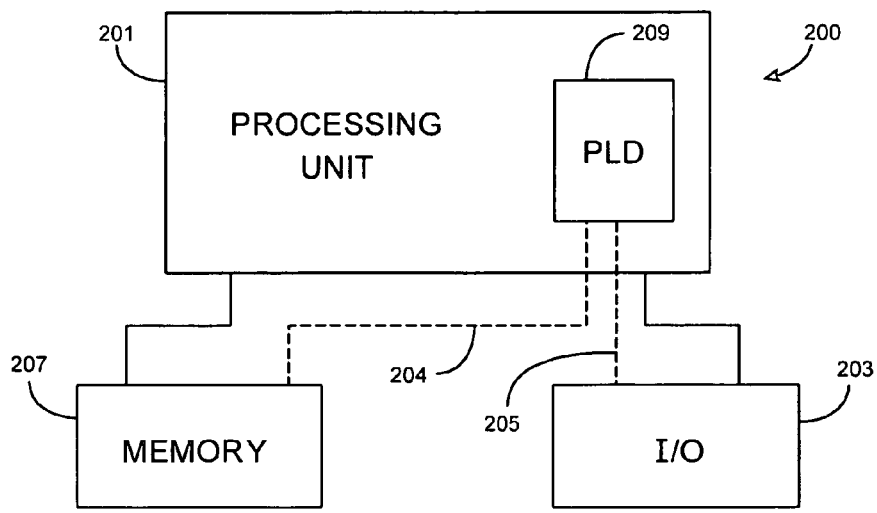
FIG. 2 is a block diagram of an electronic system that can implement embodiments of the present invention.

A PLD configured according to the techniques of the present invention can be used in system in which the PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 201, a memory unit 207, and an I/O unit 203 interconnected together by one or more buses. According to this exemplary embodiment, a programmable logic device 209 is embedded in processing unit 201. PLD 209 may serve many different purposes within the system in FIG. 2. PLD 209 may, for example, be a logical building block of processing unit 201, supporting its internal and external operations. PLD 209 is programmed to implement the logical functions necessary to carry on its particular role in system operation. PLD 209 may be specially coupled to memory 207 through connection 204 and to I/O unit 203 through connection 205. Processing unit 201 may direct data to an appropriate system component for processing or storage, execute a program stored in memory 207, receive and transmit data via I/O unit 203, or other similar function.

Processing unit 201 may be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU. For example, instead of a CPU, one or more PLDs 209 may control the logical operations of the system. In an embodiment, PLD 209 acts as a reconfigurable processor, which can be reprogrammed as needed to handle a particular computing task. Alternately, programmable logic device 209 may itself include an embedded microprocessor. Memory unit 207 may be a random access memory (RAM), read only memory (ROM), fixed or flexible disk media, PC Card flash disk memory, tape, or any other storage means, or any combination of these storage means.

Figure 3:
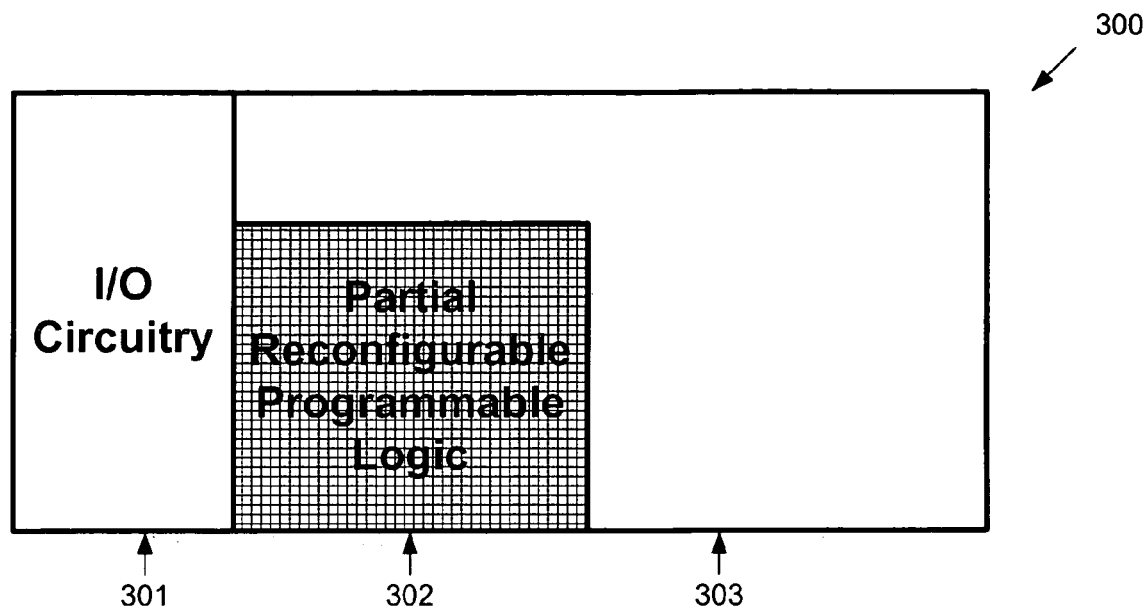
FIG. 3 is a diagram of a portion of a device with the resources, including partial reconfigurable programmable logic, necessary to implement the circuits of an embodiment of the present invention.

FIG. 3 illustrates portion 300 of a device that can implement the present invention. I/O circuitry 301 supports the physical interconnect required by the interface being serviced. It contains the required analog circuitry and a de-serializer. In one embodiment of the present invention, the de-serializer may be capable of shifting the parallel data by advancing or retarding the clock cycle at which parallel data is sampled into the parallel clock domain. This feature is useful because it greatly reduces the number of possible alignment circuits 501 (see FIG. 5).

Region 302 of 300 is a programmable circuit that can be reprogrammed while static region 303 remains active. Region 303 implements static functions, which are performed by circuits that do not need to be altered during operation. Region 303 can be a technology such as, but not limited to, one or more of the following: partial reconfigurable programmable logic, field programmable gate arrays, programmable logic arrays, configurable logic arrays, gate array, application specific integrated circuit. Region 302 can be any partial reconfigurable programmable logic technology as long as it meets the requirements described above for the given interface protocol.

According to embodiments of the present invention, circuit 300 is part of a field programmable gate array, a programmable logic device, a programmable logic array, a configurable logic array, etc. that includes a partially reconfigurable portion 302. According to other embodiments of the present invention, circuit 300 is part of an application specific integrated circuit that includes a reconfigurable programmable portion 302.

Figure 4:
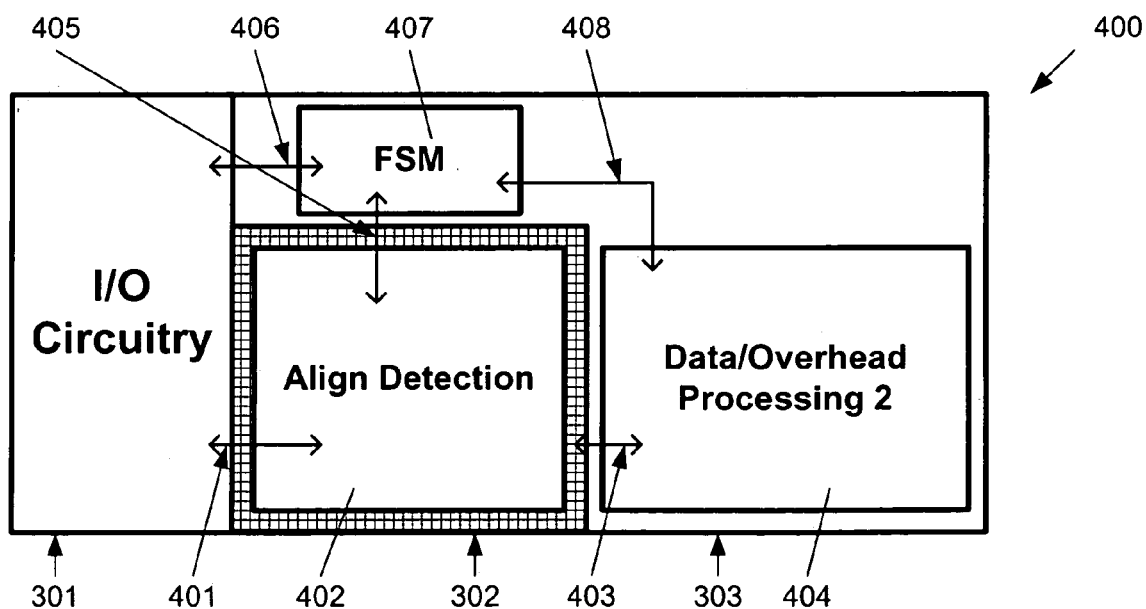
FIG. 4 illustrates the same device in FIG. 3 with circuits configured to include framing and/or training FSM block, an alignment detection block, and one part of a data and/or an overhead processing block according to an embodiment of the present invention.
Figure 5:
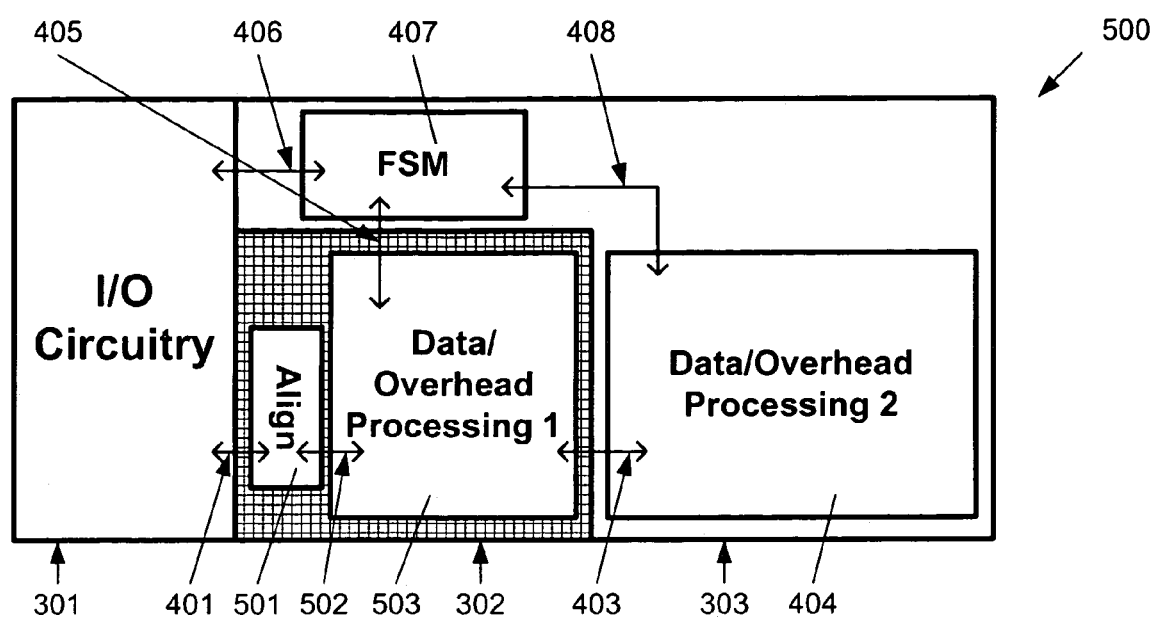
FIG. 5 is a diagram of the same device in FIG. 3 with circuits reconfigured to include a framing and/or training FSM block, an alignment block, and two parts of a data and/or overhead processing block according to an embodiment of the present invention.

FIG. 4 and FIG. 5 illustrate portion 300 of a device with the circuits necessary to implement a SONET/SDH receiver. FIG. 4 and FIG. 5 represent two mutually exclusive operating states of the receiver. Circuits 301, 407, 404 and interconnect 401, 406 remain functionally identical for both states. The circuits in region 302 are functionally completely different during both states. For both states, the circuits in region 302 interface to the static region 303 with the same interconnect 405, 403, but the function of the interconnect may be different.

The de-serializer of I/O circuitry 301 selects sets of N bits from the input data stream, where N is the number of bits in a parallel word. When input data is serially initially received by circuit 301, it is not known initially which bit of the input is the first in a frame or in a word. The N bits are arbitrarily selected from the input data stream, so the selected N bits may correspond to a complete word or portions of two adjacent words.

There are N possible combinations of contiguous N bits in any set of N input bits. For example, a sequence of input bits 11001010 includes two words 1100 and 1010, where each word contains 4 bits. A random selection of 4 contiguous bits in this example input pattern may be 0010. This random selection of 4 bits includes bits from two adjacent words. Because a random selection of input bits may include bits from two adjacent words, every possible contiguous combination of N input bits is provided to one of a plurality of detectors in align detection block 402. Only one of these combinations of bits contains a complete word.

When circuit 400 receives a stream of data, frame alignment detection block 402 determines the boundaries between different frames in the input data. According to an embodiment of the present invention, the word boundary is defined to coincide with the frame boundary. Thus, the output signals on interconnect lines 405 of frame alignment detection block 402 indicate the position of boundaries between frames and the position of words. Circuit 400 recognizes words that have N bits.

The detectors in block 402 compare each contiguous combination of N bits to framing patterns F6 and 28 to determine if the N bits are the first bytes (A1 and A2) in a SONET frame. If one set of the contiguous combinations of N bits matches the framing patterns for bytes A1 and A2, these N bits may be located at a frame boundary. Frame Alignment detection block 402 generates signals on interconnect 405 that indicate the boundaries between frames and the boundaries between words. Further details regarding how frame alignment detection block 402 determines frame and word boundaries are discussed in commonly-assigned U.S. patent application Ser. No. 10/340,203 to Ambrose et al.; filed Jan. 10, 2003, which is incorporated by reference herein.

Align detection block 402 can detect different framing patterns that are used for different data transmission protocols. The framing patterns for the A1 and A2 bytes in SONET frames are discussed herein for illustrative purposes only and are not intended to limit the scope of the present invention. Align detection block 402 can detect different framing patterns that are used for various data transmission protocols. The techniques of the present invention can apply to numerous data transmission protocols such as SONET, SDH, and OIF SPI4 phase 2.

The output signals of frame alignment detection block 402 are input to framing FSM block 407. Framing FSM block 407 samples and stores the vector output signals from the detectors in block 402. Framing FSM 407 determines when these stored values indicate framing is rightly found. This may occur after a single indication of a detected boundary, or after some repetition at a specific interval. The process of determining if framing is rightly found may constitute several states within FSM 407. Thus, FSM 407 is responsible for more than just swapping circuits in 302.

Circuit 400 implements alignment detection functionality with the framing FSM 407 in an alignment detection state. Framing FSM 407 determines when signals on interconnect 405 rightly indicate boundaries between frames. Then, framing FSM block 407 reconfigures partial reconfigurable logic region 302. At the same time, framing FSM block 407 may send signals on interconnect 406 to I/O circuitry 301 to request that I/O circuitry 301 make an alignment change to its output 401. The type of alignment change, and the function of signals on interconnect 406 depends on the available features of I/O circuitry 301.

Align detection block 402 locates boundaries in an imprecise way, because it only matches the framing pattern at one instance. In the presence of bit errors, or if the protocol does not guarantee that the framing pattern only exists at frame boundaries, then block 402 may indicate true boundaries and false boundaries. Framing FSM block 407 determines if the boundaries detected by align detection block 402 are truly frame boundaries or not by methods that may involve probability and/or hysteresis.

Once framing FSM block 407 determines that boundaries between frames and words is rightly found by sampling input 405, framing FSM block 407 reconfigures region 302 of circuit 300. Framing FSM 407 contains logic that is able to reconfigure region 302 to perform new functions. Framing FSM block 407 reconfigures some or all of the programmable logic connections in block 302 and overwrites some or all of the data stored in memory in block 302 to perform the new functions. Framing block 407 does not reconfigure portions of circuit 303. If circuit 303 is programmable logic, then region 302 is partially reconfigurable, in that a subset of the programmable elements in circuit device 300 can be reconfigured without reconfiguring other programmable elements in circuit device 300.

While FSM 407 is in an alignment detection state, or while FSM 407 is reconfiguring region 302, signal 408 indicates to data and overhead processing circuit 404 that signals 403 are not valid. Circuit 404 is disabled by signals 408 until region 302 is configured as in circuit 500 where signals 403 are connected to another portion of the data and overhead processing circuit 503, which is implemented in the partial reconfigurable region 302. The process of reconfiguring a partial reconfigurable circuit is dependent on the facilities of the implementation of the partial reconfigurable circuit. The partial reconfigurable circuit block 302 should be able to be completely reconfigured in less than the period of a data frame (125 μs in SONET). Alternatively, region 302 should be capable of being completely reconfigured within the allowable amount of time a protocol may provide between an alignment seeking state, and an operating state.

Framing FSM block 407 uses the value of the detector output signals to determine which stored configuration of a byte alignment block will produce aligned data. The FSM facilitates loading this stored configuration information into the partial reconfigurable logic circuit to produce the desired word align block 501. The number of alignment circuits that need to be stored may be as high as N, the width of the data path in bits. The number may be reduced as discussed above regarding features of the de-serializer.

Framing FSM block 407 can include a controller or processor that monitors the output signals of block 402 and performs the partial reconfiguration functionality of region 302. The processor or controller may be hardwired into circuit 300 in one embodiment. In another embodiment, programmable logic elements in circuit 300 are configured to perform the functions of a processor or controller.

Framing FSM block 407 coordinates the transfer of configuration bits that are used to reconfigure block 302. The configuration bits may be stored in either region 303, on the same chip outside of portion 300, or on a separate chip.

Specifically, framing FSM block 407 reconfigures region 302 by overwriting the frame alignment detection block 402 to implement alignment block 501 and data/overhead processing block 503 as shown in FIG. 5. Alternatively, block 407 overwrites alignment block 501 and data/overhead processing block 503 with an alignment detection circuit 402 as shown in FIG. 4.

Circuit 500 is a circuit that corresponds to an operating state of FSM 407. Word align block 501 aligns bits of the input parallel data stream 401 to form sets of N bits that are in the correct bit positions of complete N-bit words. FSM block 407 determines which of several possible word align blocks 501 to implement in order to have an output 502 with the correct bit positions. Aligned data 502 is input into data/overhead processing block 503.

In alternative implementations for different protocols, the programmable logic in alignment block 501 is reconfigured to implement channel alignment circuits. The information about skew is reported to the training FSM by signals 405 while FSM 407 is in an alignment detection state. When in an operating state, circuit 501 implements a delay circuit for each channel, such that the output of all channels are aligned to a common clock. The output signals 502 are input into a data/overhead processing block 503. The nature of these aligning circuits is that they are comprised entirely of routing and flip-flops (no logic), and thus require very few configuration bits to implement.

In circuit 500, once input data bits have been word aligned by block 501, the data bits are processed by data/overhead processing block 503. One of the functions of processing block 503 is to detect when the alignment appears to no longer be valid. In SONET and SDH systems, this is accomplished by monitoring the A1 and A2 framing bytes. As long as the framing pattern of A1 and A2 bytes occur at 125 μs intervals from the initial frame boundary determined by alignment detection block 402, then region 302 maintains the alignment and processing circuits as shown in FIG. 5.

At some time, the processing block 503 may not match enough of the framing pattern at 125 μs intervals, because of very high bit error rate, a defect in the system, or a change in frame position. If the framing pattern no longer appears to be occurring every 125 μs, then processing block 503 sends a signal 405 to FSM 407. FSM 407 will use this signal to determine when it should reconfigure region 302 to perform alignment detection once again as in FIG. 4. Thus, framing FSM block 407 can reconfigure programmable circuit elements in circuit region 302 into the blocks shown in FIG. 4 or FIG. 5 as needed.

The present invention conserves programmable circuit elements within an integrated circuit, because a subset of programmable circuit elements 302 are used to implement frame boundary alignment detection block 402 and word alignment block 501 at different times. Therefore, less programmable logic elements are used to perform the required functions. This technique conserves programmable circuit elements and frees up resources on a programmable integrated circuit that can be used to perform other important functions.

Figure 6:
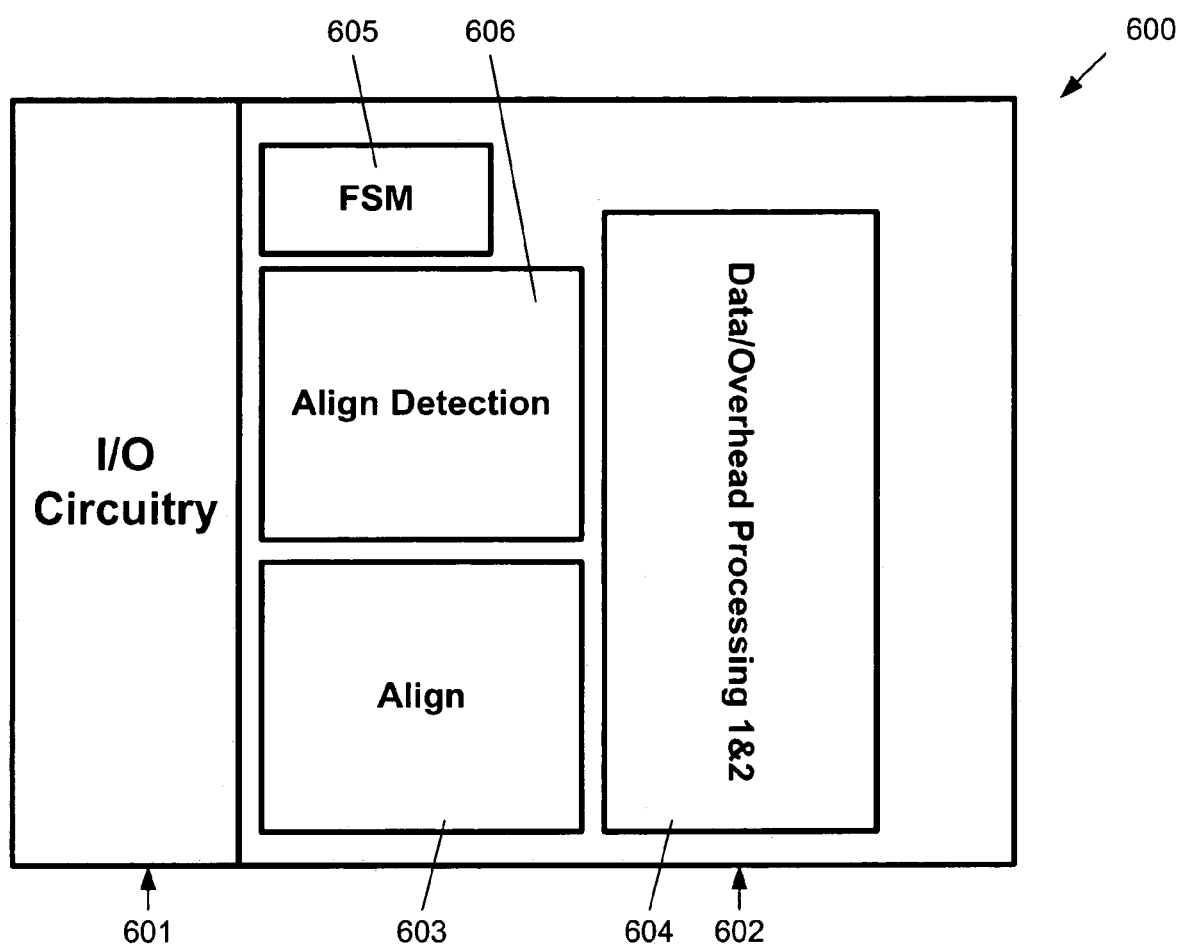
FIG. 6 is a diagram of a different device without partial reconfigurable logic implementing the same functions as the circuits in FIG. 4 and FIG. 5.

Additionally, because word alignment block 501 only implements an alignment circuit for one bit position, it is much smaller than an alignment circuit that could select any alignment as would be needed in a non-reconfigurable implementation as shown in FIG. 6. FIG. 6 shows how the same functions described above and illustrated in FIGS. 4 and 5 could be implemented without partially reconfigurable programmable logic. Integrated circuit 600 includes I/O circuitry 601 and region 602. Region 602 includes data/overhead processing block 604, align detection block 606, finite state machine (FSM) 605, and align block 603. Details of the operation of blocks 601, 603, 605, and 606 are discussed in further detail in commonly-assigned U.S. patent application Ser. No. 10/340,203 to Ambrose et al., mentioned above.

The FSM block in FIG. 6 is slightly smaller as it would not have the function of reconfiguring supplementary to its function of a framing FSM. In some systems, this difference could outweigh the increase in logic needed to implement the larger alignment block as well as concurrently implementing the alignment detection and processing blocks.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. For example, the present invention encompasses numerous data transmission protocols such as SONET STS-1, STS-3, STS-12, STS-24, STS-48, STS-192, etc. The present invention also includes locating words framing patterns in SDH frames and training patterns in OIF SPI4 phase 2. It is intended that the invention not be limited to the particular embodiments disclosed, but that the invention will include all embodiments and equivalents falling within the scope of the claims.

What is claimed is:

1. An integrated circuit comprising:
   partially reconfigurable programmable circuit elements for alternately implementing a first circuit and a second circuit; and
   a finite state machine,
   wherein the finite state machine configures the partially reconfigurable programmable circuit elements to implement the first circuit to detect boundaries between words in an input data stream,
   when the finite state machine determines the partially reconfigurable programmable circuit elements correctly indicate boundaries between frames in the input data stream, the finite state machine overwrites at least a portion of the first circuit to implement the second circuit to align the words in the input data stream based on the detected word boundaries and to determine when the word boundaries have changed, and
   when the finite state machine determines the word boundaries have changed, the finite state machine overwrites at least a portion of the second circuit to implement the first circuit to detect boundaries between words in the input data stream.

2. The integrated circuit according to claim 1 further comprising:
    data and overhead processing circuitry.
3. The integrated circuit according to claim 1 further comprising:
    input/output circuitry that receives the input data stream.
4. The integrated circuit according to claim 1 wherein the integrated circuit includes portions of hardwired, application-specific circuitry.
5. The integrated circuit according to claim 1 wherein the integrated circuit is a field programmable gate array.
6. The integrated circuit according to claim 1 wherein:
    the finite state machine reconfigures the partially reconfigurable programmable circuit elements to locate framing patterns in SONET input data.
7. The integrated circuit according to claim 6 wherein:
    the finite state machine reconfigures the partially reconfigurable programmable circuit elements to align frames in the SONET input data stream based on the detected boundaries.
8. The integrated circuit according to claim 1 wherein:
    the finite state machine reconfigures the partially reconfigurable programmable circuit elements to locate framing patterns in SDH frames in the input data stream.
9. The integrated circuit according to claim 8 wherein:
    the finite state machine reconfigures the partially reconfigurable programmable circuit elements to align frames in the SDH input data based on the detected boundaries.
10. The integrated circuit according to claim 1 wherein:
    the finite state machine reconfigures the partially reconfigurable programmable circuit elements to locate training patterns in OIF SPI4 phase 2 input data.
11. The integrated circuit according to claim 10 wherein:
    the finite state machine reconfigures the partially reconfigurable programmable circuit elements to align channels in the OIF SPI4 phase 2 input data based on the detected training patterns.
12. A method comprising:
    configuring reconfigurable programmable circuit elements to implement a first circuit to detect boundaries between words in input data using a finite state machine, wherein the finite state machine determines when the reconfigurable circuit elements correctly indicate boundaries between frames in the input data;
    overwriting at least a portion of the first circuit to implement a second circuit to align the words in the input data based on the detected word boundaries and to determine when the word boundaries have changed using the finite state machine, and
    overwriting at least a portion of the second circuit when the finite state machine determines the word boundaries have changed in order to implement the first circuit to detect boundaries between words in input data using a finite state machine.
13. The method of claim 12 further comprising:
    processing overhead and data bytes in the input data using data and overhead processing circuitry.
14. The method of claim 12 further comprising:
    receiving the input data at input/output circuitry.
15. The method of claim 12 wherein the method is implemented using an integrated circuit including portions of hardwired, application-specific circuitry.
16. The method of claim 12 wherein the method is implemented using an integrated circuit that is a field programmable gate array, and the reconfigurable programmable circuit elements are partially reconfigurable.
17. The method of claim 12 wherein reconfiguring the partially reconfigurable programmable circuit elements further comprises:
    reconfiguring the partially reconfigurable programmable circuit elements to locate framing patterns in SONET input data using the finite state machine.
18. The method of claim 17 wherein reconfiguring the partially reconfigurable programmable circuit elements further comprises:
    reconfiguring the partially reconfigurable programmable circuit elements to align frames in the SONET input data stream based on the detected boundaries.
19. The method of claim 12 wherein reconfiguring the partially reconfigurable programmable circuit elements further comprises:
    reconfiguring the partially reconfigurable programmable circuit elements to locate framing patterns in SDH input data using the finite state machine.
20. The method of claim 19 wherein reconfiguring the partially reconfigurable programmable circuit elements further comprises:
    reconfiguring the partially reconfigurable programmable circuit elements to align frames in the SDH input data based on the detected boundaries.
21. The method of claim 12 wherein reconfiguring the partially reconfigurable programmable circuit elements further comprises:
    reconfiguring the partially reconfigurable programmable circuit elements to locate training patterns in OIF SPI4 phase 2 input data.
22. The method of claim 21 wherein reconfiguring the partially reconfigurable programmable circuit elements further comprises:
    reconfiguring the partially reconfigurable programmable circuit elements to align channels in the OIF SPI4 phase 2 input data based on the detected training patterns.

* * * * *